United States Patent [19]

Stevance et al.

[11] Patent Number: 4,847,571
[45] Date of Patent: Jul. 11, 1989

[54] MICROWAVE OSCILLATOR INTEGRATED IN A WAVEGUIDE

[75] Inventors: Jean Stevance, Aulnay Sous Bois; Edmond Klein, Orsay; Georges Lleti, Paris, all of France

[73] Assignee: Thomson Hybrides et Microondes, Paris, France

[21] Appl. No.: 169,460

[22] Filed: Mar. 17, 1988

[30] Foreign Application Priority Data

Mar. 19, 1987 [FR] France .................................. 87 03837

[51] Int. Cl.⁴ ............................................... H03B 7/14
[52] U.S. Cl. ................................ 331/96; 331/107 DP; 331/177 V
[58] Field of Search ................ 331/96, 107 DP, 177 V

[56] References Cited

U.S. PATENT DOCUMENTS 4,588,967 5/1986 Horn et al. ...................... 331/107 G
4,728,907 3/1988 Cohen ........................... 331/107 DP

FOREIGN PATENT DOCUMENTS 0005096 10/1979 European Pat. Off. .
0068946 1/1983 European Pat. Off. .

OTHER PUBLICATIONS

Wescon Technical Papers, vol. 20, No. 20, 1976, pp. 1-8, North Hollywood, US; K. P. Weller: "Solid State Millimeter Wave Sources" p. 6, lines 1-38, FIG. 10.
IEEE Transactions on Microwave Theory and Techniques, vol. 24, No. 10, Oct. 1976, pp. 650-656, New York US; K. M. Johnson: "Posttuning Drift of a Transferred-Electron-Device Voltage-Controlled Oscillator".

Primary Examiner—Siegried H. Grimm
Attorney, Agent, or Firm—Oblon, Fisher, Spivak, McClelland & Maier

[57] ABSTRACT

A negative-resistance diode oscillator tuned by a varactor as applicable to frequency-modulated transmitters or to receiver oscillators operating within the 56-100 GHz frequency band is integrated in a waveguide. The diode is encapsulated in a capped package and mounted on a ground-connected base. A coupling capacitor is fixed on the metallic cap of the package. A varactor having beam-lead connections is mounted as a bridge between the capacitor and a ground-connected metallic stud. The bias voltages are brought in the plane of the waveguide by means of two wires and two capacitors housed within orifices formed through the waveguide walls.

6 Claims, 2 Drawing Sheets

MICROWAVE OSCILLATOR INTEGRATED IN A WAVEGUIDE

BACKGROUND OF THE INVENTION

1. Field of the Invention

The present invention relates to a voltagetunable microwave diode oscillator integrated in a waveguide. This oscillator includes a varactor which is also integrated in the waveguide and operates in the W band in the vicinity of 94 GHz. The presence of the varactor permits easy frequency adjustment as well as frequency modulation of the oscillator.

2. Description of the Prior Art

Microwave oscillators of the transistor or diode type are well-known. As a general rule, it is preferably sought to stabilize them by means of a dielectric resonator, for example, thus making it possible to mount them in association and to obtain higher power outputs. However, with the technological advances achieved in the field of microwaves within the range of a few GHz to 100 GHz, consideration is now being given to the possibility of exchanging information by frequency modulation, more particularly within the 94-GHz window since it is known that the atmosphere is transparent within this frequency range. The general objective to be met accordingly consists in making effective use of the experience acquired in the radiofrequency range in the vicinity of 100 MHz by transposing this experience to the vicinity of 94 GHz.

SUMMARY OF THE INVENTION

The oscillator in accordance with the invention comprises a metallic waveguide having an internal cross-section of 2.54×1.27 mm within which is positioned a negative-resistance diode. This diode is encapsulated in a case or so-called package which is closed by a metallic cap. On the cap is fixed a coupling capacitor and on the free plate of said capacitor is soldered one of the two connections of a varactor mounted as a beam lead. The other connection of the varactor is soldered to a grounded metallic stud. The two bias voltages of the diode and the varactor are supplied through the waveguide walls by means of two wires.

In more precise terms, the invention relates to a microwave oscillator integrated in a waveguide and having a negative-resistance diode frequency-tuned by a varactor. The distinctive features of the oscillator are as follows:

the diode encapsulated in a capped package is mounted on a metallic base and located at a level of one wall of the waveguide, a coupling capacitor is fixed on the metallic cap of the package by means of one of its electrodes, the varactor encapsulated in a package having beam-lead connections is mounted as a bridge between the free access electrode of the capacitor and a groundconnected metallic stud fixed on the base, the diode bias voltage is supplied by means of a wire soldered on the cap, and the varactor bias voltage is supplied by means of a wire soldered on the free access electrode of the coupling capacitor.

DETAILED DESCRIPTION OF THE INVENTION

Figure 1:
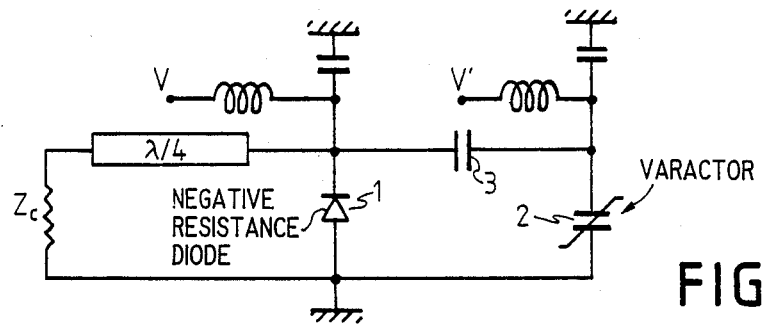
FIG. 1 is an electrical diagram of the microwave voltage-controlled oscillator in accordance with the invention.

As shown in the electric circuit diagram of FIG. 1, the voltage-controlled oscillator (VCO) includes a negative-resistance diode 1 such as an avalanche diode, Gunn diode, Impatt diode and so forth. The circuit also includes a varactor 2 which is coupled to the diode 1 via a coupling capacitor 3. The diode 1 is biased by a voltage V applied by means of a circuit which includes an inductive portion and which is decoupled from ground by a capacitor in accordance with current practice. The varactor is also biased by a voltage V' supplied by a circuit which also has an inductive portion and is decoupled from ground by a capacitor.

Figure 2:
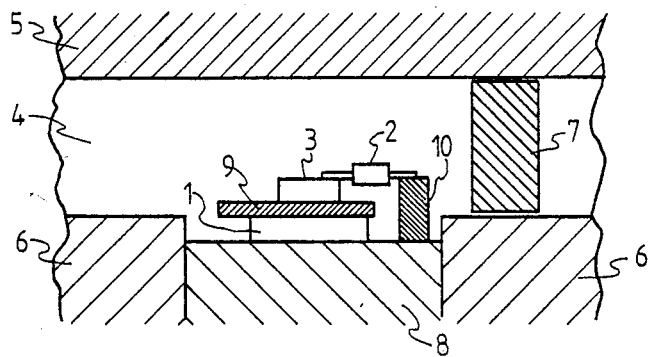
FIG. 2 is a sectional view of the oscillator in accordance with the invention, the oscillator being integrated in a waveguide.

In fact, the diode 1 is mounted within a case or so-called package as shown in cross-section in FIG. 2. This package has a cover 9 designated as a cap, the diameter of which is so adjusted as to restore to the avalanche diode an impedance $Z_c$ such that the conditions of excitation of oscillations are satisfied. In FIG. 1, the line $\lambda/4$ represents the cap of the diode encapsulation package and $Z_c$ represents the radiation impedance of the cap.

By varying the capacitance of the varactor 2 which is controlled by the bias voltage V', the capacitance connected in parallel with the diode 1 is caused to vary, thus permitting easy adjustment of the emission frequency of the oscillator or frequency modulation of this latter.

FIG. 2 is a sectional view of said oscillator as integrated within a waveguide. The waveguide is composed of two metallic blocks 5 and 6 provided with grooves so as to form a waveguide including a cavity 4 which, at the frequencies considered, has internal dimensions at 2.54 mm in width and 1.27 mm in height. This cavity is closed on one side by a short-circuit piston 7, the variable position of which makes it possible to adjust the oscillation within the cavity 4. An orifice is pierced in one of the two waveguide blocks such as the block 6, for example, a metallic support 8 being passed through said orifice and provided with a screw-thread in order to permit height-adjustment of the diode.

On the free and flat face of the metallic support 8 is fixed the diode 1 which is represented in FIG. 2 solely by the ring of dielectric material which forms the package, said package being closed by a metallic disk 9 which forms the aforementioned cap. This disk has a larger diameter than the ring of dielectric material in order to restore a predetermined impedance in the diode. By means of one of these electrodes, there is fixed on said metallic disk a capacitor 3 which performs the function of decoupling capacitance between the diode 1 and the varactor 2.

Moreover, a metallic stud 10 located next to the diode encapsulation package is fixed on the support 8 and therefore connected to ground. The height of the metallic stud 10 is equivalent to the total height of the diode encapsulation package plus the capacitor 3, which makes it possible to solder a varactor 2 in the form of a beam-lead package, that is to say with external access connections made by beam leads and mounted as a bridge between the capacitor 3 and the metallic stud 10.

Figure 3:
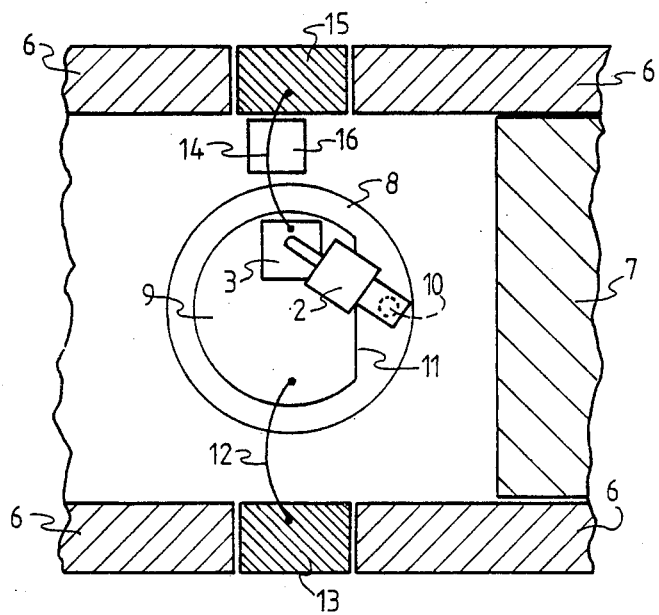
FIG. 3 is a plan view of the oscillator in accordance with the invention and corresponding to the sectional view of FIG. 2.

The structure of this oscillator within the waveguide as well as the biasing system is more clearly brought out by FIG. 3 which repeats the object of FIG. 2 along a plane substantially at the level of the diode cap. It is therefore apparent from FIG. 3 that the cap 9 is slightly cut back at 11 outside the encapsulation package of the diode 1 so as to permit attachment of the ground-connection stud. However, it is in fact not essential to cut back the cap 9 and the operation can be carried out in the same manner if the base 8 has a sufficient diameter to make this possible.

Whereas in the prior art, the oscillating diode is biased in the majority of instances by means of a metallic antenna which extends downwards at right angles with respect to the cap 9, the arrangement in accordance with the invention is such that in this oscillator, the bias connections of the diode and of the varactor are located in a plane parallel to that of the cap 9 and pass through the lateral walls of the waveguide. Thus the oscillating diode is biased by means of a wire or metallic strip, one end of which is soldered on the cap 9 and the other end of which is soldered to a decoupling capacitor 13 which performs the function of a plug for closing the orifice formed in the waveguide wall 6. Similarly, the varactor 2 is biased by means of a wire or metallic strip 14 soldered at one end to the top face of the decoupling capacitor 3 and at another end to a decoupling capacitor 15 which closes the orifice formed in another wall of the waveguide. The orifices pierced through the two opposite walls of the waveguide are rectangular orifices having dimensions of 1×0.36 mm, thus forming a cutoff waveguide at operating frequencies of the VCO. As stated earlier, this oscillator operates in the region of 94 GHz and a channel having a dimension of 1 mm cuts-off frequencies below 150 GHz. In consequence, the two rectangular channels cut-off the frequencies of the VCO, particularly as they are partially closed either by the decoupling capacitors 13 and 15 or by metallic lines etched on dielectric substrates which obturate the channels aforesaid.

The position of the oscillator within the waveguide is optimized if it is oriented in the manner shown in FIGS. 2 and 3. Accordingly, the elements such as the varactor 2, the coupling capacitor 3, the metallic stud 10 and the face 11 of the cap 9 are preferentially disposed on the side nearest the piston 7. In consequence, the oscillator package face which is directed towards the active load of the waveguide remains unmodified with respect to known oscillators in which the varactor is not introduced within the waveguide.

In regard to the connecting wires or strips 12 and 14, the connection nearest the varactor or in other words the connection 14 must be carefully studied in order to avoid parasitic resonances. Thus in circuit assemblies which have been constructed, it has been found that a piece of dielectric material 16 such as "Eccosorb" placed beneath the wire 14, between the wire 14 and the waveguide wall, makes it possible to eliminate the second harmonic of the signal which causes a major disturbance in the operation of the VCO.

In order to construct the voltage-controlled oscillator, silicon avalanche diodes having a mean power rating (200 mW) were employed. The varactors are P+N junction varactors fabricated in a beam-lead structure and having the following main characteristics:

| Breakdown voltage: | $V_{BD} \geq 20$ volts |
|---|---|
| Junction capacitance at $0^V$: | $C_{jo} = 0.1$ to $0.15$ pf |
| Junction capacitance ratio: | $\dfrac{C_j \max}{C_j \min} \geq 3$ |
| Cutoff frequency at $-4$ volts measured at a frequency higher than or equal to 30 GHz: $f_{C-4}$: | $\geq 1000$ GHz |

Figure 4:
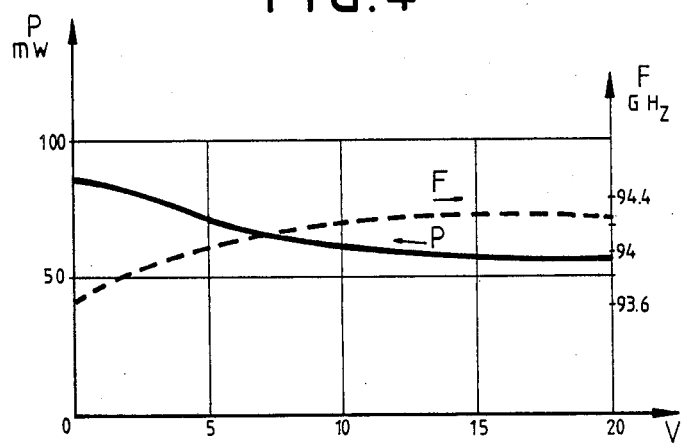
FIGS. 4 and 5 show curves of variation of power and frequency as a function of the voltage applied to the varactor in the case of two oscillators constructed in accordance with the invention.
Figure 5:
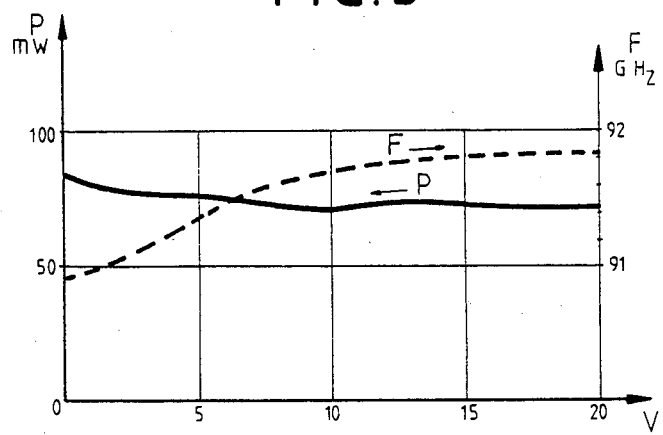

FIGS. 4 and 5 give curves of variation of power and frequency as a function of the voltage applied to the varactor in the case of two oscillators selected from those which have been fabricated. The differences which appear in the results of these two oscillators correspond solely to differences which are inherent in the fabrication of semiconductors and microwave cavities having very small dimensions and requiring very delicate adjustments.

More precisely, these two oscillators have produced the results given below:

| FIG. 4 | |
|---|---|
| Max. power ($V_{varactor} = 0$) | 87 mW |
| Min. power ($V_{varactor} = 20$ volts) | 56 mW |
| ΔP | 1.91 dB |
| Min. frequency ($V_\nu = 0$) | 93.6 GHz |
| Max. frequency ($V_\nu = 20^\nu$) | 94.3 GHz |
| Δf | 700 MHz |
| FIG. 5 | |
| Max. power ($V_\nu = 0$) | 84 mW |
| Min. power ($V_\nu = 20^\nu$) | 74 mW |
| ΔP | 0.55 dB |
| Min. frequency ($V_\nu = 0$) | 90.9 GHz |
| Max. frequency ($V_\nu = 20^\nu$) | 91.85 GHz |
| Δf | 950 MHz |

It is apparent that the oscillator in accordance with the invention has a tuning band which may attain 1 GHz in respect of a center frequency of the order of 94 GHz. This property is advantageous in frequency-modulated transmitters or as a local oscillator of a microwave receiver. The microwave oscillator in accordance with the invention is defined in the appended claims.

What is claimed is:

1. A microwave oscillator integrated in a waveguide and having a negative-resistance diode frequency-tuned by a varactor, wherein:
   the diode encapsulated in a capped package is mounted on a metallic base and located at the level of one wall of the waveguide,
   a coupling capacitor is fixed on the metallic cap of the package by means of one of its electrodes,
   the varactor encapsulated in a package having beam-lead connections is mounted as a bridge between the free access electrode of the capacitor and a groundconnected metallic stud fixed on the base,
   the diode bias voltage is supplied by means of a wire soldered on the cap, and the varactor bias voltage is supplied by means of a wire soldered on the free access electrode of the coupling capacitor.

2. A microwave oscillator according to claim 1 wherein, the waveguide being closed on one side by a short-circuit piston, the stud for fixing the varactor is located between the diode and the short-circuit piston.

3. A microwave oscillator according to claim 2, wherein the cap for closing the diode package is cut back on the side nearest the ground-connection stud which is fixed on the base.

4. A microwave oscillator according to claim 1, wherein the bias voltages of the diode and of the varactor are brought in the plane of the waveguide through two orifices pierced in two lateral walls of said waveguide, the dimensions of said orifices at cutoff being related to the operating frequency of the oscillator.

5. A microwave oscillator according to claim 4, wherein the lateral walls of the waveguide are traversed by a microstrip filter or capacitor on a substrate and wherein said capacitor closes-off the orifice in the waveguide wall.

6. A microwave oscillator according to claim 4, wherein a small volume of absorbent material placed between the waveguide and the varactor bias wire eliminates the second harmonic of the operating frequency of the oscillator.

* * * * *